(12) United States Patent
Matsuda

(10) Patent No.: US 7,875,538 B2
(45) Date of Patent: Jan. 25, 2011

(54) SEMICONDUCTOR DEVICE HAVING SCHOTTKY JUNCTION AND METHOD FOR MANUFACTURING THE SAME

(75) Inventor: Keita Matsuda, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 65 days.

(21) Appl. No.: 11/944,953

(22) Filed: Nov. 26, 2007

(65) Prior Publication Data

US 2008/0121934 A1 May 29, 2008

(30) Foreign Application Priority Data

Nov. 24, 2006 (JP) .............................. 2006-316508

(51) Int. Cl.
*H01L 29/778* (2006.01)
*H01L 21/338* (2006.01)
(52) U.S. Cl. .................... 438/572; 438/570; 438/571; 438/167; 438/172; 257/192; 257/194
(58) Field of Classification Search ................. 257/449, 257/473, E33.064

See application file for complete search history.

(56) References Cited

U.S. PATENT DOCUMENTS

| | | | | |
|---|---|---|---|---|
| 6,392,262 | B1 * | 5/2002 | Shiraishi ...................... | 257/280 |
| 6,395,588 | B2 * | 5/2002 | Igarashi et al. ............... | 438/172 |
| 6,573,129 | B2 * | 6/2003 | Hoke et al. ................... | 438/167 |
| 6,787,826 | B1 * | 9/2004 | Tserng et al. ................. | 257/280 |
| 6,797,994 | B1 * | 9/2004 | Hoke et al. ................... | 257/192 |
| 6,803,598 | B1 * | 10/2004 | Berger et al. ................. | 257/25 |
| 7,352,017 | B2 * | 4/2008 | Nakagawa et al. ........... | 257/194 |
| 2002/0119610 | A1 * | 8/2002 | Nishii et al. ................. | 438/167 |
| 2003/0164290 | A1 * | 9/2003 | Chen et al. .............. | 204/192.29 |
| 2004/0159865 | A1 * | 8/2004 | Allen et al. .................. | 257/280 |
| 2004/0206979 | A1 * | 10/2004 | Braddock ..................... | 257/192 |
| 2004/0207029 | A1 * | 10/2004 | Braddock ..................... | 257/410 |
| 2005/0003574 | A1 * | 1/2005 | Yang et al. ..................... | 438/99 |
| 2005/0012113 | A1 * | 1/2005 | Sheu et al. ................... | 257/184 |
| 2005/0059197 | A1 * | 3/2005 | Yamashita et al. ........... | 438/198 |
| 2005/0184299 | A1 * | 8/2005 | Matsumura et al. ........... | 257/79 |
| 2006/0108602 | A1 * | 5/2006 | Tanimoto ..................... | 257/192 |
| 2006/0145201 | A1 * | 7/2006 | Shiga .......................... | 257/280 |
| 2006/0284318 | A1 * | 12/2006 | Murata et al. ................ | 257/758 |
| 2007/0138506 | A1 * | 6/2007 | Braddock ..................... | 257/192 |
| 2007/0207626 | A1 * | 9/2007 | Nishi .......................... | 438/758 |
| 2007/0235824 | A1 * | 10/2007 | Rakshit et al. ............... | 257/414 |
| 2007/0269968 | A1 * | 11/2007 | Saxler et al. ................. | 438/522 |
| 2007/0278532 | A1 * | 12/2007 | Kosaki et al. ................ | 257/214 |
| 2008/0121895 | A1 * | 5/2008 | Sheppard et al. .............. | 257/76 |
| 2008/0233285 | A1 * | 9/2008 | Das et al. ................. | 427/248.1 |

FOREIGN PATENT DOCUMENTS

JP 2002-319682 A 10/2002

* cited by examiner

*Primary Examiner*—Leonardo Andújar
*Assistant Examiner*—William Harriston
(74) *Attorney, Agent, or Firm*—Westerman, Hattori, Daniels & Adrian, LLP

(57) ABSTRACT

A semiconductor device includes: a nitride semiconductor layer including a channel layer, a Schottky electrode that contacts the nitride semiconductor layer and contains indium, and an ohmic electrode that contacts the channel layer. The nitride semiconductor layer includes a layer that contacts the Schottky electrode and contains AlGaN, InAlGaN or GaN. The Schottky electrode that contains indium includes one of an indium oxide layer and an indium tin oxide layer.

6 Claims, 18 Drawing Sheets

ANNEAL

Fig. 2

| SAMPLE # | WAFER | SCHOTTKY ELECTRODE | ATMOSPHERE |
|---|---|---|---|
| A | a | Ni/Au=80/100nm | N2 |
| B | | ITO/Ni/Au=50/80/100nm | N2 |
| C | b | ITO/Ni/Au=50/80/100nm | AIR |
| D | | ITO/Ni/Au=50/80/100nm | N2 |
| E | c | InO/Ni/Au=50/80/100nm | N2 |

ANNEALING AT 350°C FOR 30 MINUTES

SAMPLE A PRIOR TO ANNEALING

SAMPLE C PRIOR TO ANNEALING

Fig. 17A  SAMPLE E AFTER ANNEALING
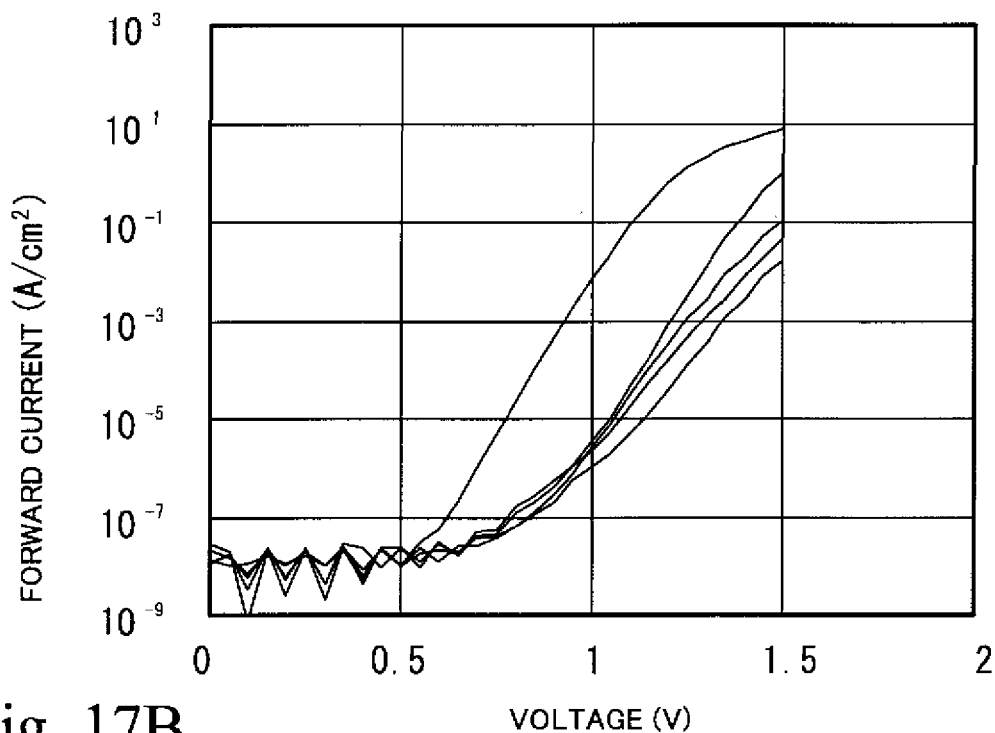
Fig. 17B
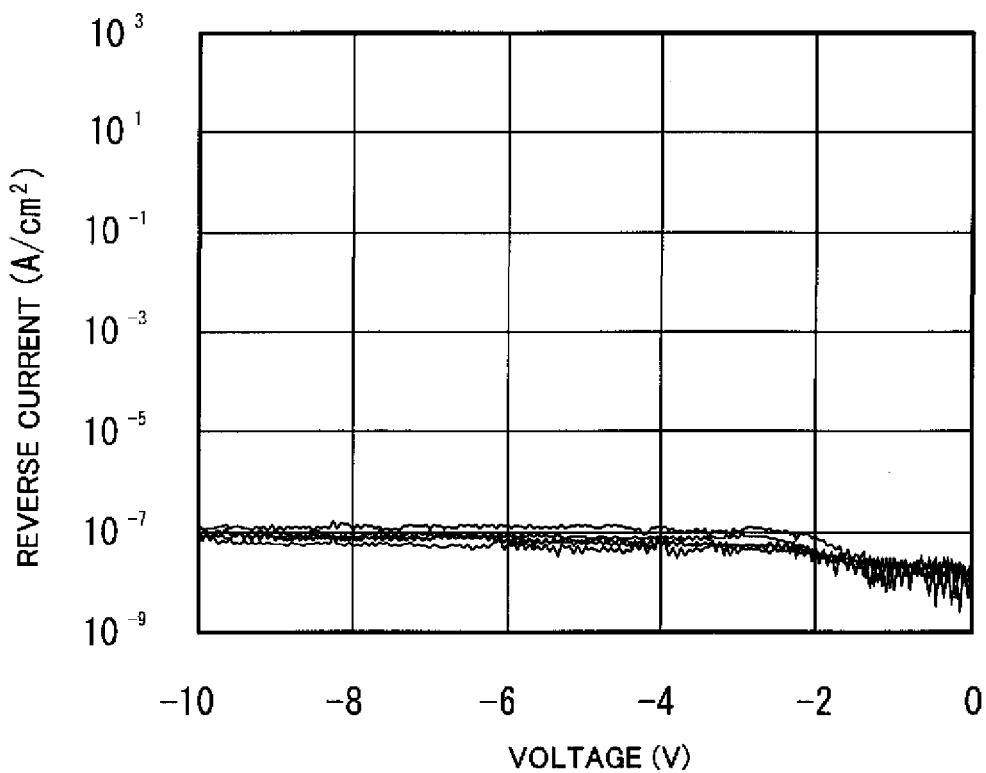

SEMICONDUCTOR DEVICE HAVING SCHOTTKY JUNCTION AND METHOD FOR MANUFACTURING THE SAME

BACKGROUND OF THE INVENTION

1. Field of the Invention

The present invention generally relates to semiconductor devices and manufacturing methods for the same, and more particularly, to a semiconductor device having a Schottky junction between a nitride semiconductor layer and a layer containing indium and a method for manufacturing such a semiconductor device.

2. Description of the Related Art

A semiconductor device containing gallium nitride (GaN) is known as a compound semiconductor device containing nitride (nitride semiconductor). Such a GaN-based semiconductor device is known as a power device capable of operating at high frequencies and outputting high power. Particularly, there has been considerable activity in the development of field effect transistors (FETs) such as high mobility electron transistors (HEMT) suitable for amplification in high-frequency bands of microwaves, quasi-millimeter waves, and millimeter waves.

Electrodes having Schottky junctions (Schottky electrodes) are used as gates of FETs and anode electrodes of diodes. The Schottky electrodes are required to have reduced leakage current. Preferably, the Schottky barrier height is increased to reduce the leakage current. Thus, the Schottky electrodes with nitride semiconductor have a structure which a metal layer having a great work function such as Ti (titanium)/Pt (platinum)/Au (gold), Ni (nickel)/Au, Pt/Au contacts a nitride semiconductor layer. Generally, the nitride semiconductor may be GaN, AlN (aluminum nitride), InN (indium nitride), AlGaN (aluminum gallium nitride) that is a mixed crystal of GaN and AlN, InGaN (indium gallium nitride) that is a mixed crystal of GaN and InN, and AlInGaN (aluminum indium gallium nitride) that is a mixed crystal of GaN, AlN and InN.

Japanese Patent Application Publication No. 2002-319682 discloses that transparent indium tin oxide (ITO) provided on a transparent channel layer made of zinc oxide is used for an electrode.

SUMMARY OF THE INVENTION

According to an aspect of the present invention, there is provided a semiconductor device having reduced leakage current flowing through the Schottky junction.

According to another aspect of the present invention, there is provided a semiconductor device including: a nitride semiconductor layer including a channel layer; a Schottky electrode that contacts the nitride semiconductor layer and contains indium; and a pair of ohmic electrodes that electrically contacts the channel layer.

According to a further aspect of the present invention, there is provided a method for manufacturing a semiconductor device including: forming a Schottky electrode that contacts a channel layer and contains indium; forming a pair ohmic electrodes that electrically contacts the channel layer; and annealing the semiconductor device in an atmosphere of an inactive gas.

BRIEF DESCRIPTION OF THE DRAWINGS

FIG. 2 shows the details of samples;

FIGS. 17A and 17B are gate current vs. voltage characteristics of sample F after annealing.

DESCRIPTION OF THE PREFERRED EMBODIMENTS

The present invention is based on the following inventor's consideration.

The Schottky barrier height cannot be increased considerably even when a metal having a great work function is used for the Schottky electrode in the Schottky junction with nitride semiconductor. It is considered that the above fact results from the pinning level on the surface of the nitride semiconductor. This makes it difficult to reduce leakage current. Further, impurities remain on the interface between the nitride semiconductor and the Schottky electrode, and increase leakage current when the interface is reverse-biased.

The present invention has been made in view of the above-mentioned circumstance.

First Embodiment

A description will now be given of a first embodiment of the present invention.

Figure 1A:
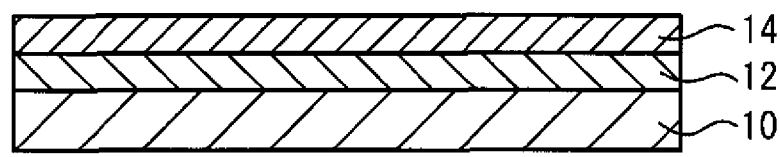
FIGS. 1A through 1D are cross-sectional views showing a method for manufacturing samples.
Figure 1B:
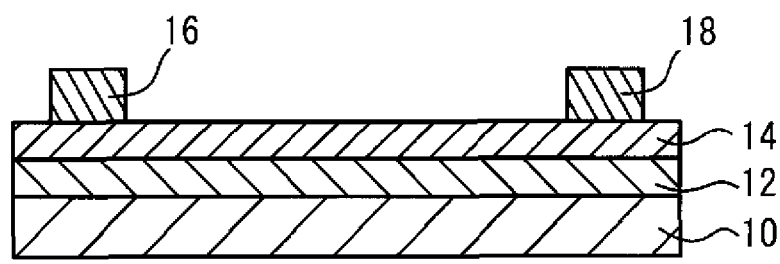
Figure 1C:
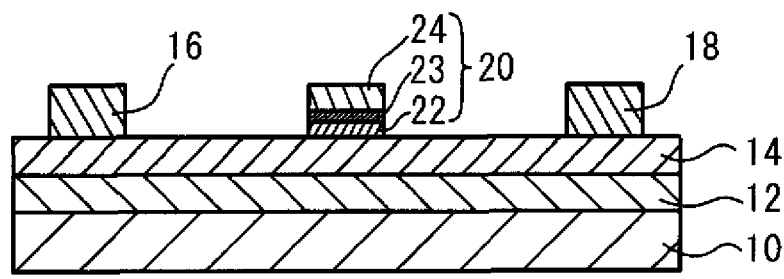
Figure 1D:
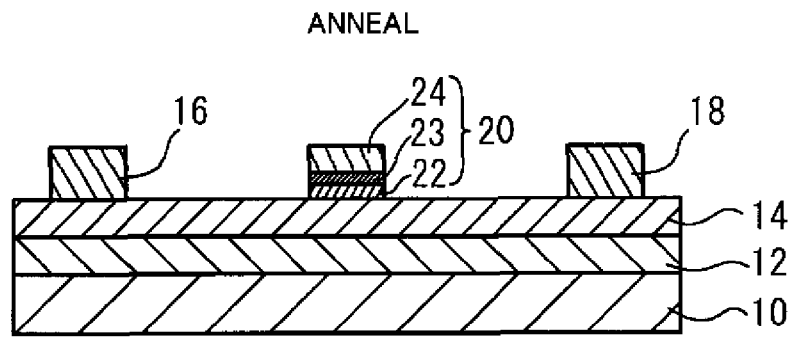

FIGS. 1A through 1D are cross-sectional views of an FET in accordance with the first embodiment. Referring to FIG. 1A, a laminate of nitride semiconductor layers is formed on a sapphire substrate 10 by MOCVD (Metal Organic Chemical Vapor Deposition). The laminate is composed of an undoped GaN electron traveling layer 12 having a thickness of 2 μm, and an undoped $Al_{0.25}Ga_{0.75}N$ electron supply layer 14 that is deposited on the electron traveling layer 12 and has a thickness of 25 nm. Referring to FIG. 1B, a pair of ohmic electrodes that electrically contact a two-dimensional electron gas (channel layer) in the electron traveling layer 12 is formed by vapor deposition and liftoff. The pair of electrodes consists of a source electrode 16 and a drain electrode 18 and is composed of Ti/Au. After the liftoff, the wafer is annealed to achieve low ohmic contact resistance. Referring to FIG. 1c, a layer 22 containing indium is formed on the electron supply layer 14 by vacuum evaporation and liftoff. An Au layer 24 is formed above the layer 22 via a barrier layer 23 by vapor deposition and liftoff. The layer 22, the barrier layer 23 and the Au layer 24 thus deposited form a gate electrode 20. The layers of the gate electrode 20, which is a Schottky electrode, will be described later in detail. Referring to FIG. 1D, the wafer is annealed at 350° C. for 30 minutes in an atmosphere, which will be described later.

FIG. 2 shows samples A through E manufactured by the above-mentioned manufacturing method shown in Figs. 1A through 1D. Samples A and B used an identical wafer "a", which was divided before the gate electrode 20 was formed. Sample A did not have the indium-contained layer 22, but had only the barrier layer 23 made of Ni deposited to a thickness of 80 nm and the Au layer 24 made of Au deposited to a thickness of 100 nm. Sample B had the indium-contained layer 22 made of ITO deposited to a thickness of 50 nm, the barrier layer 23 made of Ni deposited to 80 nm, and the Au layer 24 made of Au deposited to 100 nm. The ITO layer was grown by vapor deposition using a source of $In_2O_3$ (indium oxide) and $SnO_2$ and EB (Electron Beam) having an EB current of 10 to 20 mA. Then, samples A and B were processed identically. Samples C and D used an identical wafer "b". The gate electrodes 20 of samples C and D were ITO/Ni/Au, which was also used in sample B. The wafer "b" was divided prior to annealing in the step of FIG. 1D. Sample C was annealed in an oxygen atmosphere, and sample D was annealed in a nitrogen atmosphere. Sample E has the indium-contained layer 22 of $In_2O_3$ deposited to a thickness of 50 nm, the barrier layer 23 of Ni deposited to 80 nm, and the Au layer 24 of Au deposited to 100 nm.

Figure 3A:
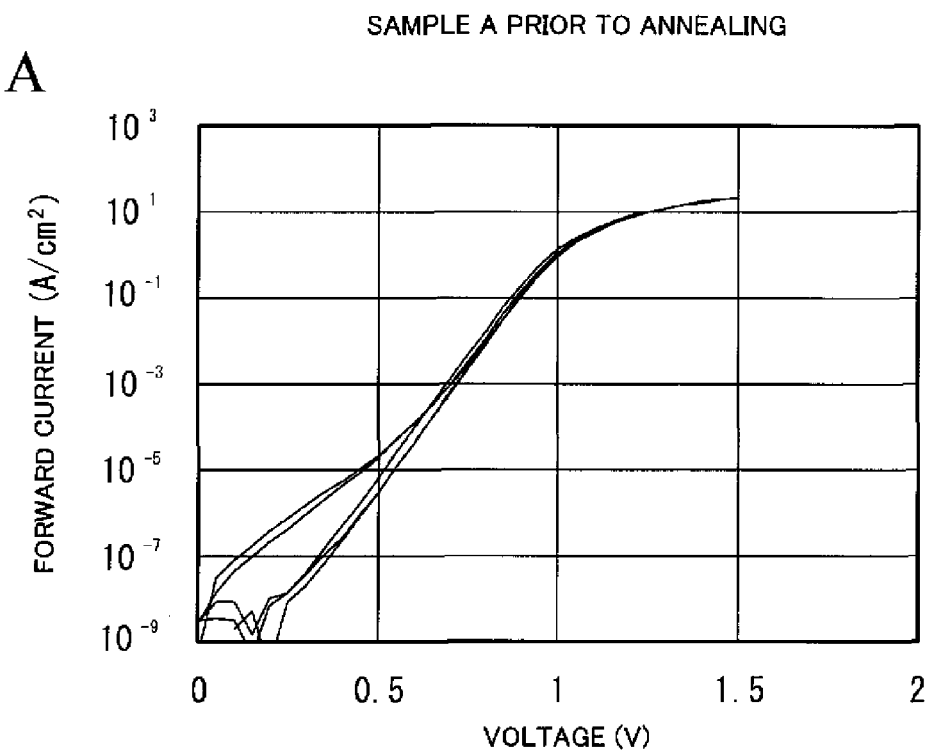
FIGS. 3A and 3B are gate current vs. voltage characteristics of sample A prior to annealing.
Figure 3B:
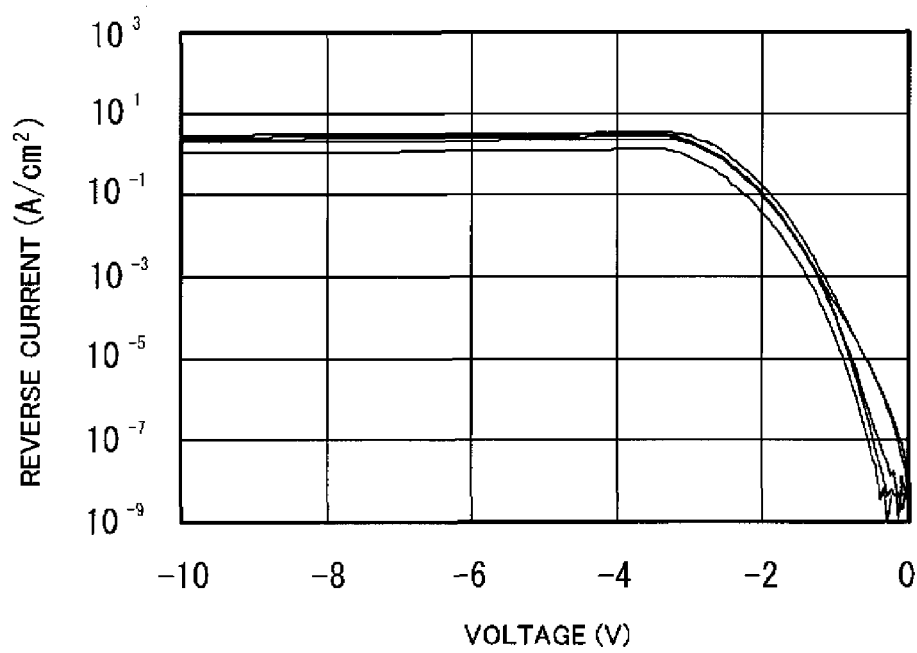
Figure 4A:
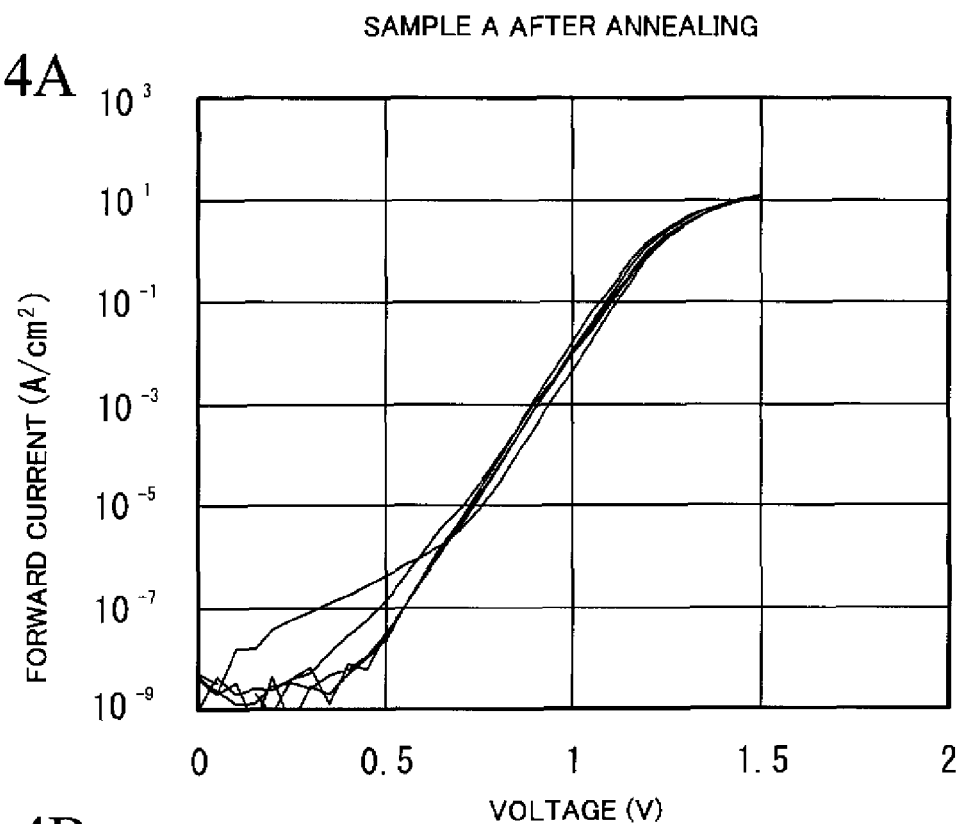
FIGS. 4A and 4B are gate current vs. voltage characteristics of sample A after annealing.
Figure 4B:
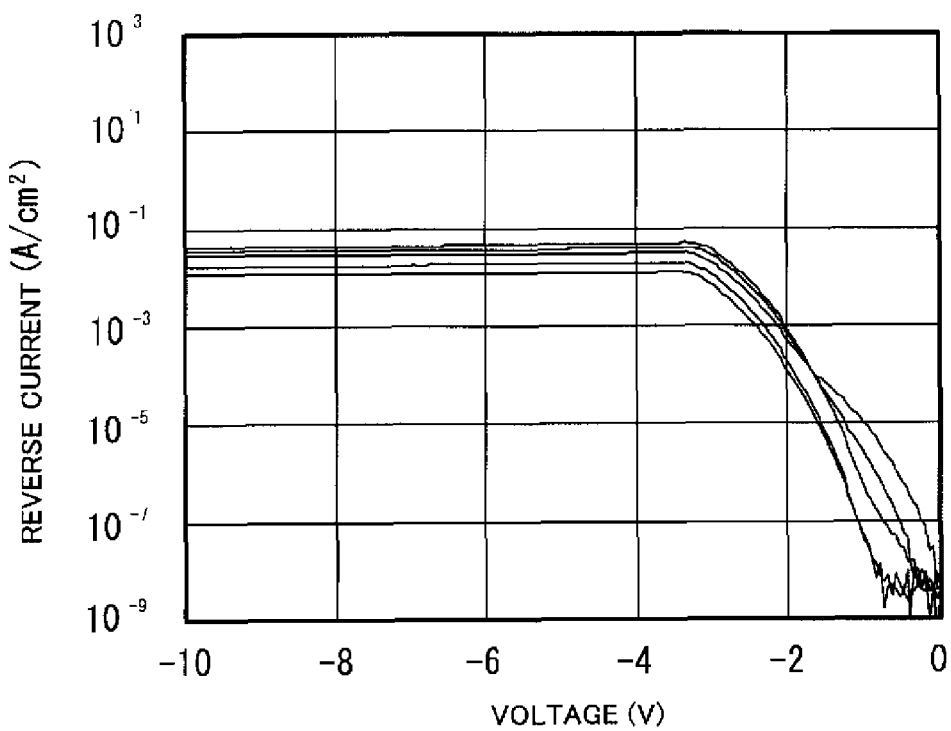

FIG. 3A shows a gate forward characteristic of sample A prior to annealing, and FIG. 3B shows a gate reverse characteristic of sample A prior to annealing. Current shown in the vertical axis of each of FIGS. 3A and 3B is represented by the amount of current per unit area ($A/cm^2$). FIGS. 4A and 4B show gate forward and reverse characteristics of sample A after annealing at 350° C. for 30 minutes. In FIGS. 3A through 4B, multiple curves are the characteristics of actual FET devices derived from wafer "a" and defined as sample A. Annealing at 350° C. realizes approximately double-digit reduction in the forward and reverse currents. The use of the Schottky electrode substituted for the conventional Ni/Au drastically reduces the leakage current through 350° C. annealing.

Figure 5A:
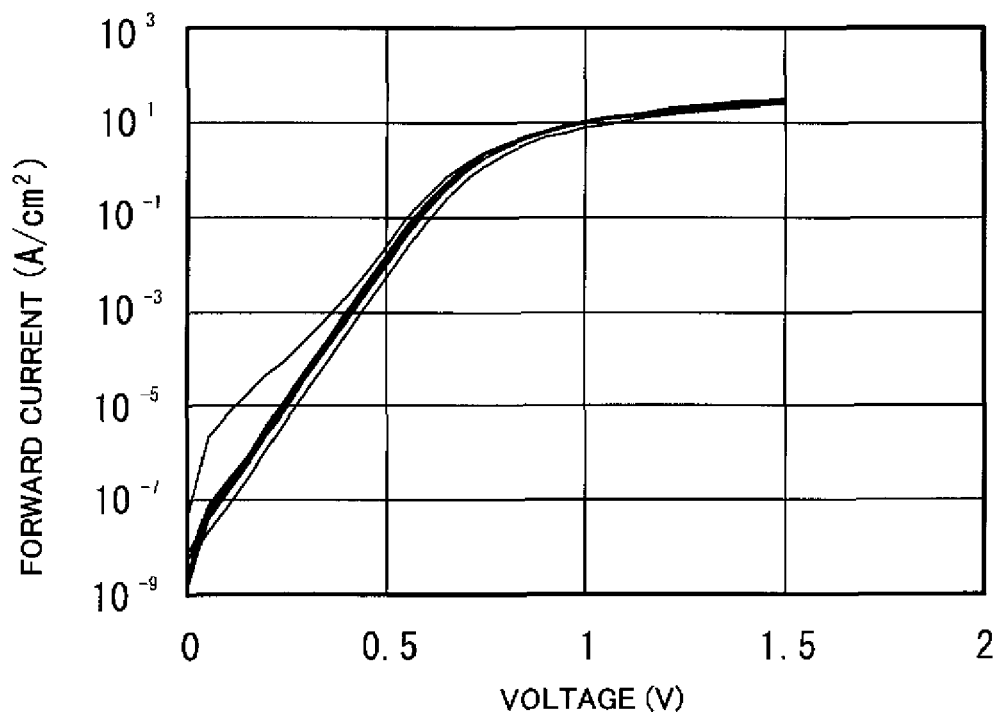
FIGS. 5A and 5B are gate current vs. voltage characteristics of sample B prior to annealing.
Figure 5B:
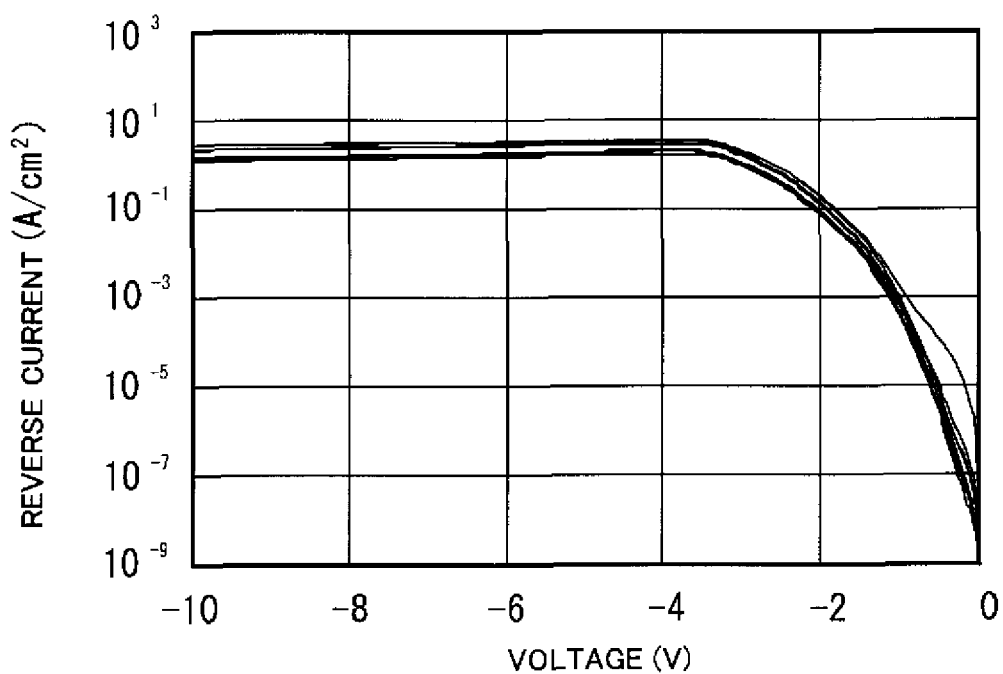
Figure 6A:
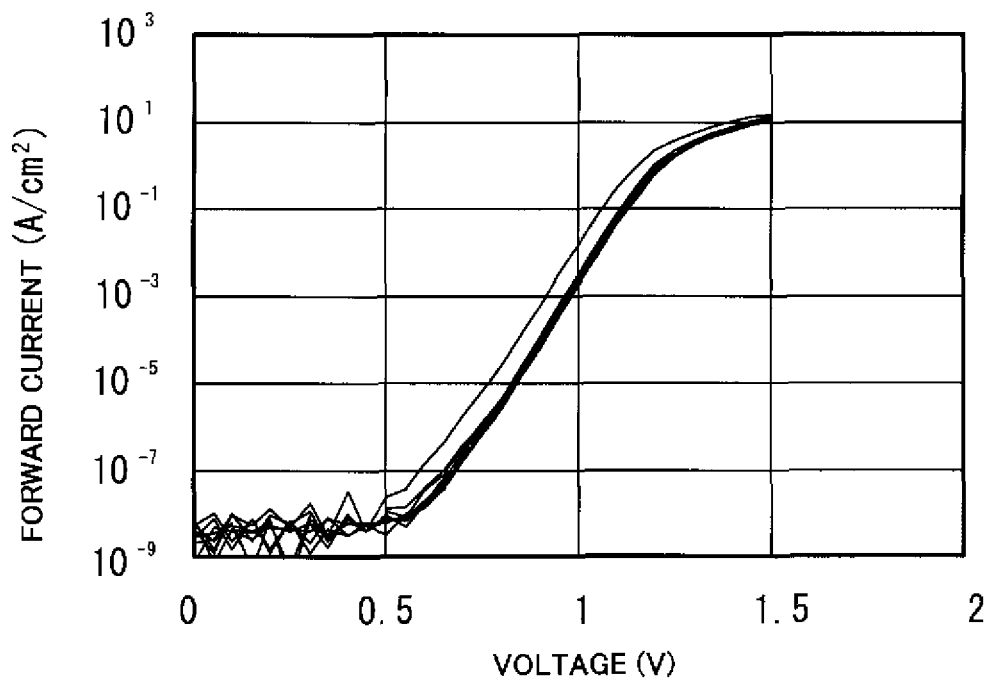
FIGS. 6A and 6B are gate current vs. voltage characteristics of sample B after annealing.
Figure 6B:
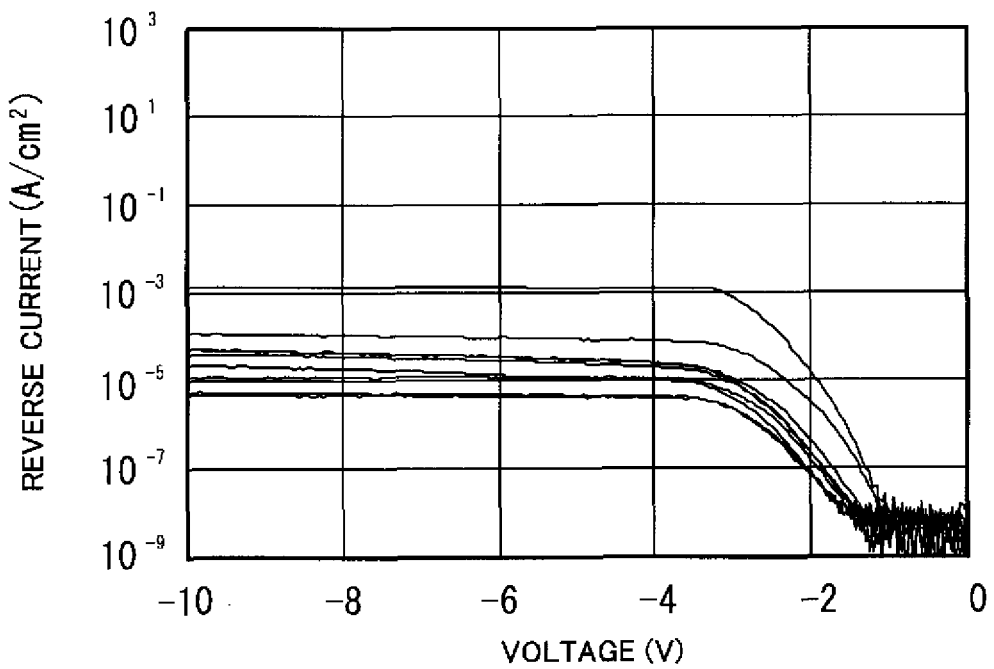

FIGS. 5A and 5B show gate forward and reverse characteristics of sample B prior to annealing. FIGS. 6A and 6B show gate forward and reverse characteristics of sample B after annealing at 350° C. for 30 minutes. Annealing at 350° C. reduces the reverse current as much as four digits. Further, the forward current starts to flow at a voltage of approximately 0.5 V. It is considered that the above facts result from an increased Schottky barrier height. Furthermore, the slopes of the forward currents become sharper and the ideality factor of the Schottky electrode becomes closer to 1. It can be seen from comparison between samples A and B that the Schottky barrier height can be increased by forming ITO on the electron supply layer 14 as the Schottky electrode and annealing the ITO layer.

Figure 7A:
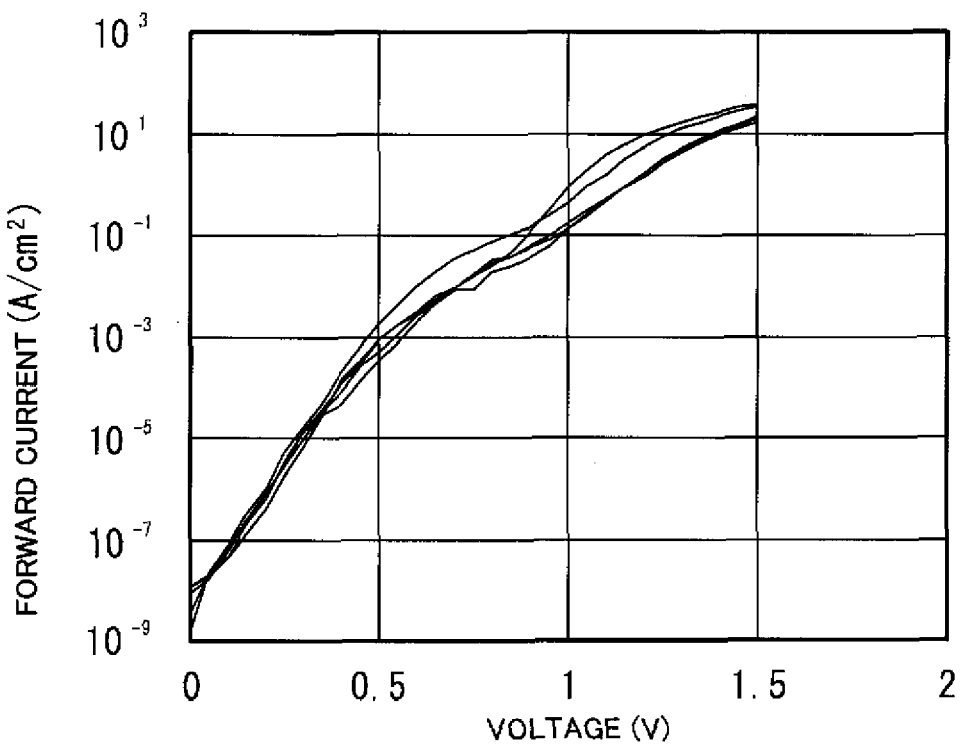
FIGS. 7A and 7B are gate current vs. voltage characteristics of sample C prior to annealing.
Figure 7B:
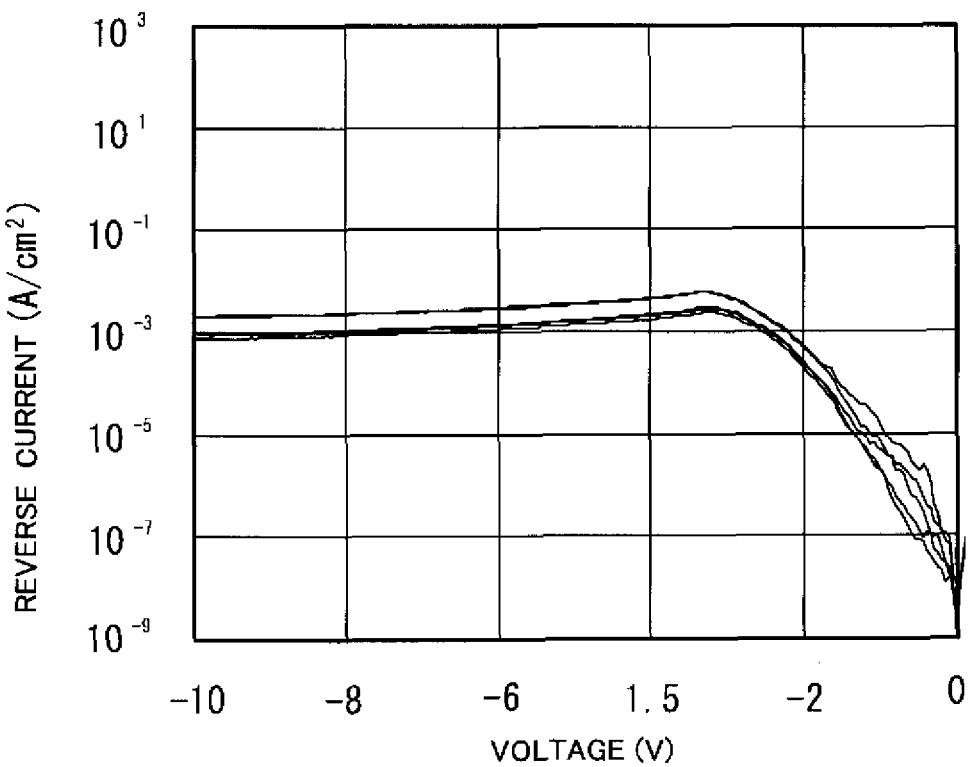
Figure 8A:
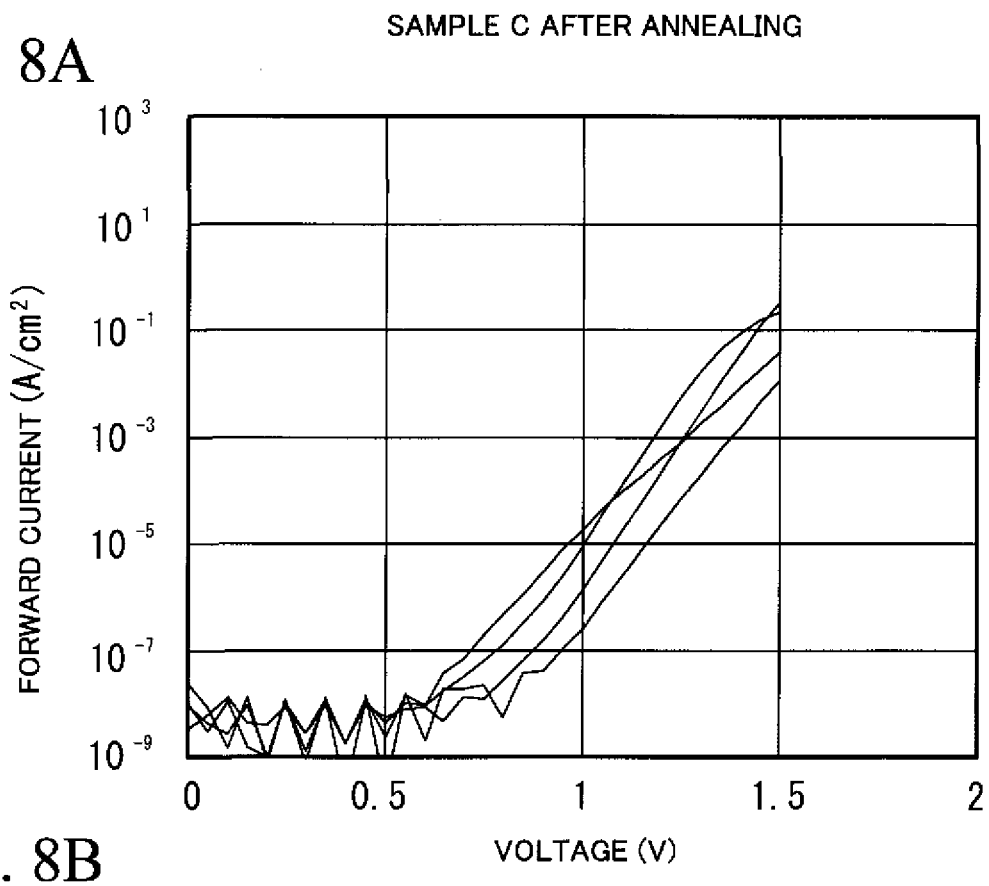
FIGS. 8A and 8B are gate current vs. voltage characteristics of sample C after annealing.
Figure 8B:
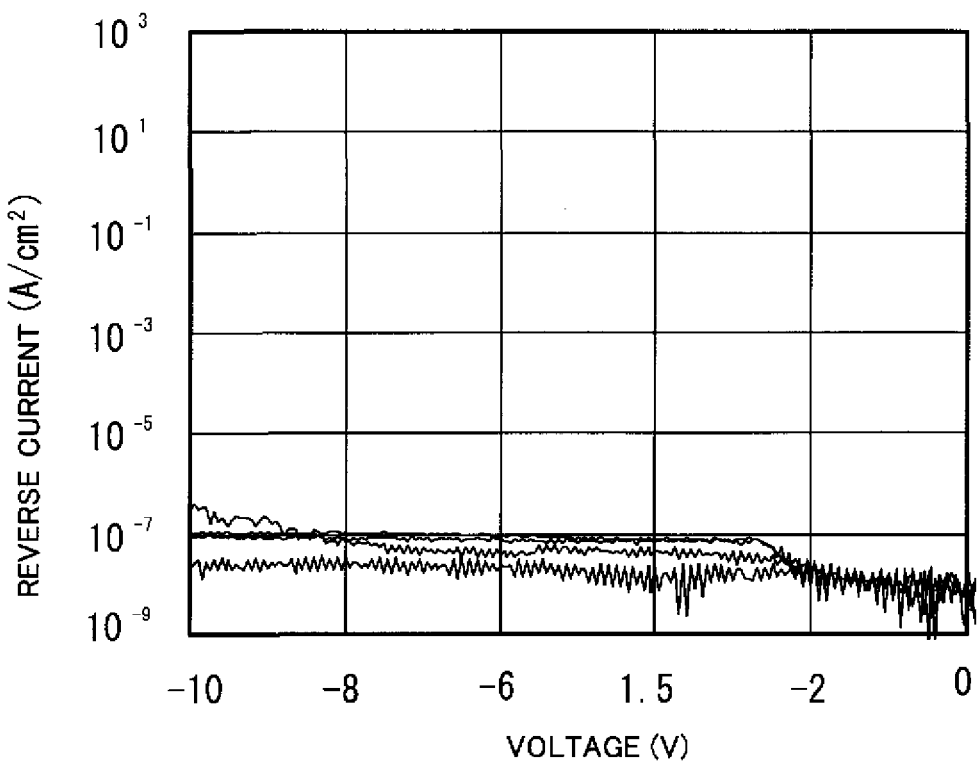
Figure 9A:
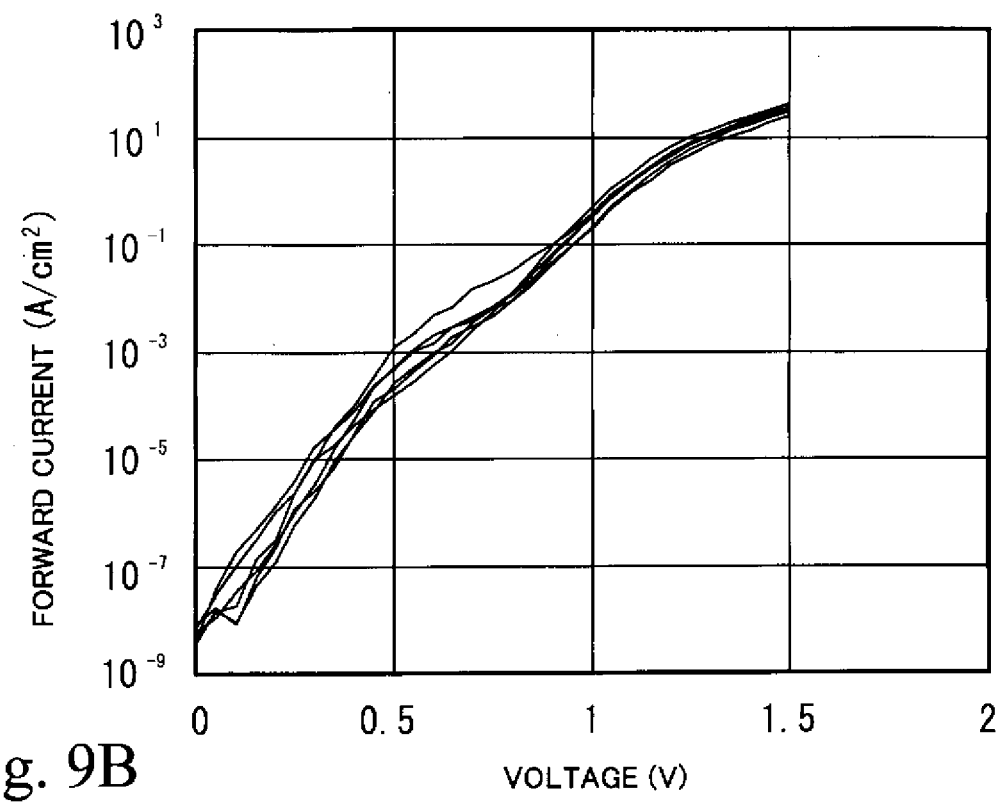
FIGS. 9A and 9B are gate current vs. voltage characteristics of sample D prior to annealing.
Figure 9B:
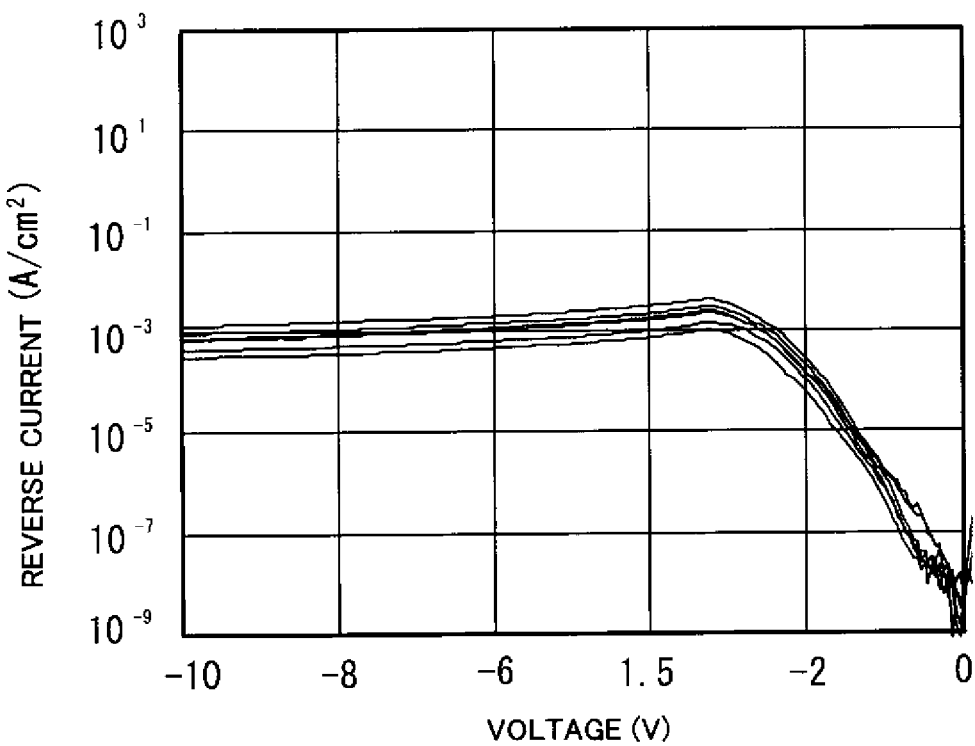
Figure 10A:
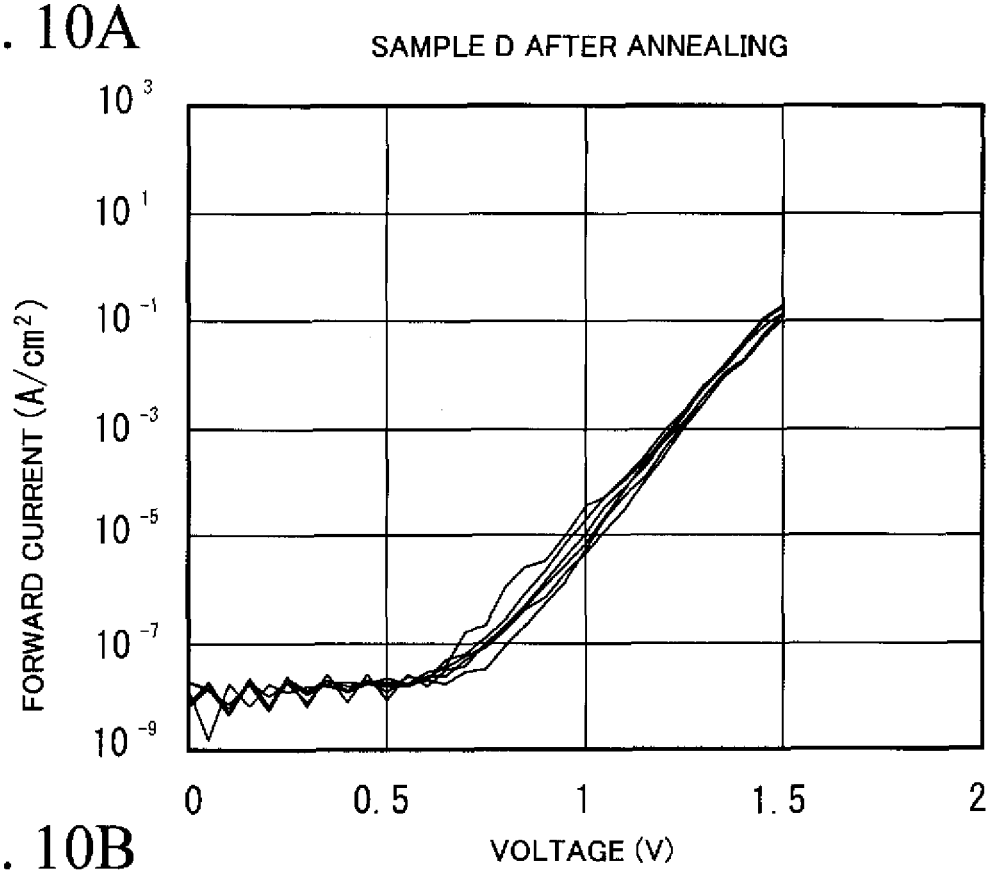
FIGS. 10A and 10B are gate current vs. voltage characteristics of sample D after annealing.
Figure 10B:
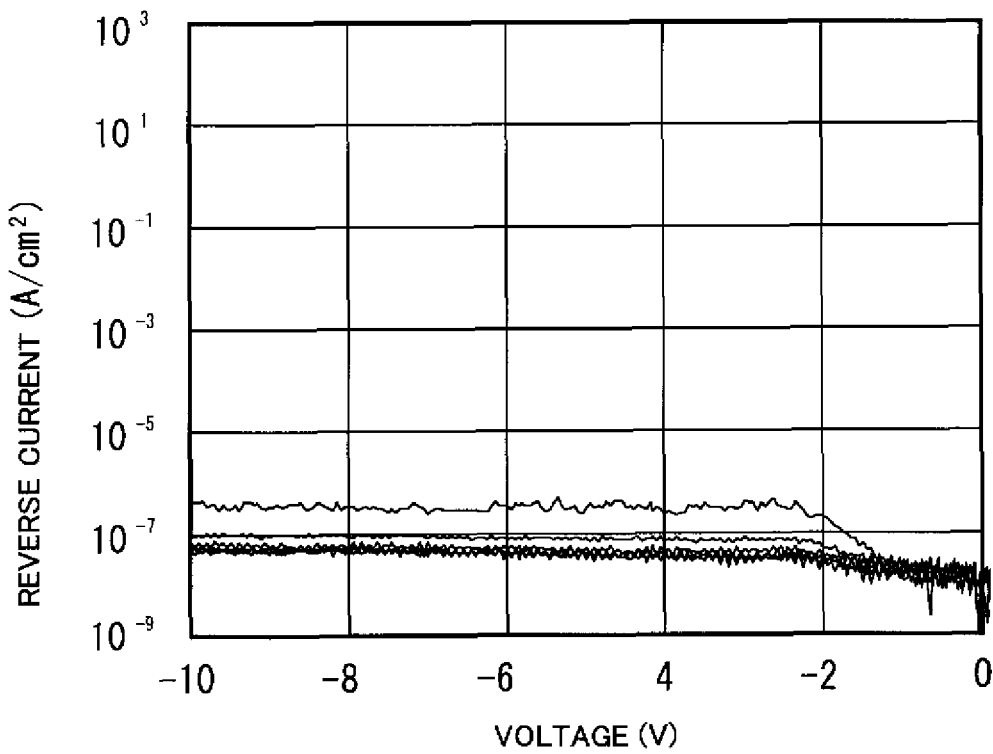

FIGS. 7A and 7B show gate forward and reverse characteristics of sample C prior to annealing. FIGS. 8A and 8B show gate forward and reverse characteristics of sample C after annealing at 350° C. for 30 minutes. FIGS. 9A and 9B show gate forward and reverse characteristics of sample D prior to annealing. FIGS. 10A and 10B show gate forward and reverse characteristics of sample D after annealing at 350° C. for 30 minutes. Annealing reduces the reverse currents of samples C and D as much as fourth digits, and the forward currents start to flow at a voltage of approximately 0.5 V. The FETs of sample C annealed in the atmosphere of oxygen has larger deviations of the forward current than those of sample D.

Figure 11:
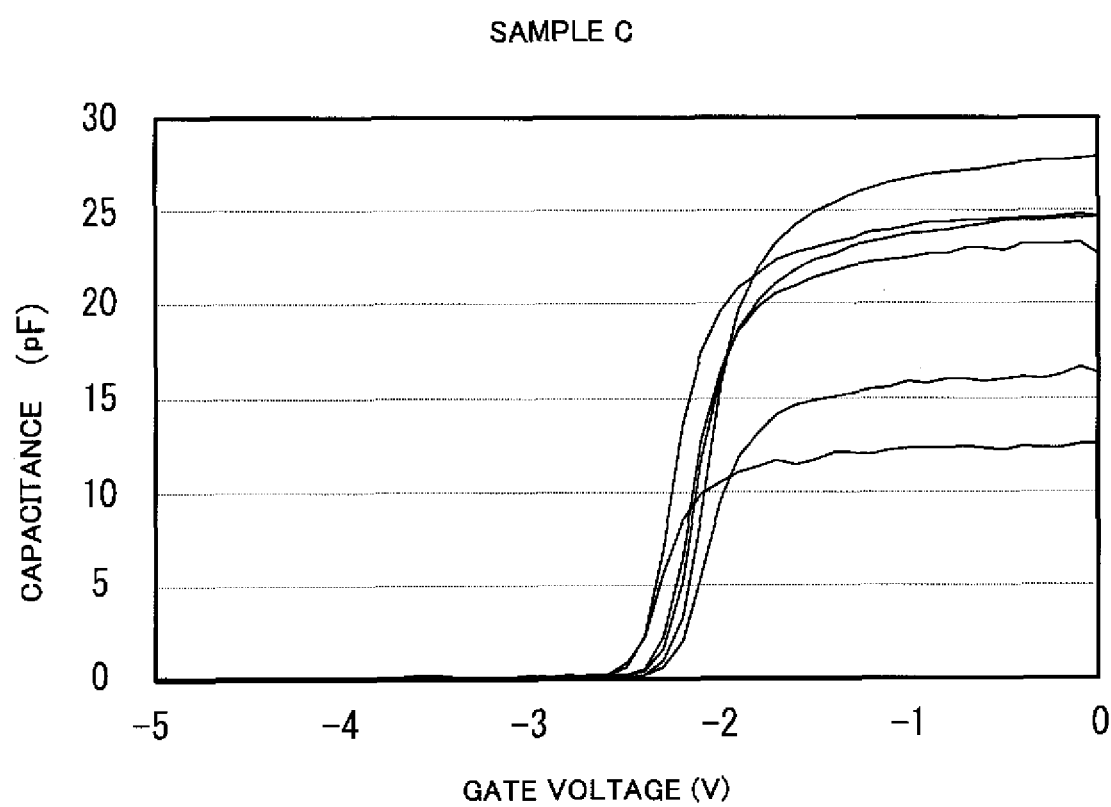
FIG. 11 is a gate capacitance vs. voltage characteristic of sample C after annealing.
Figure 12:
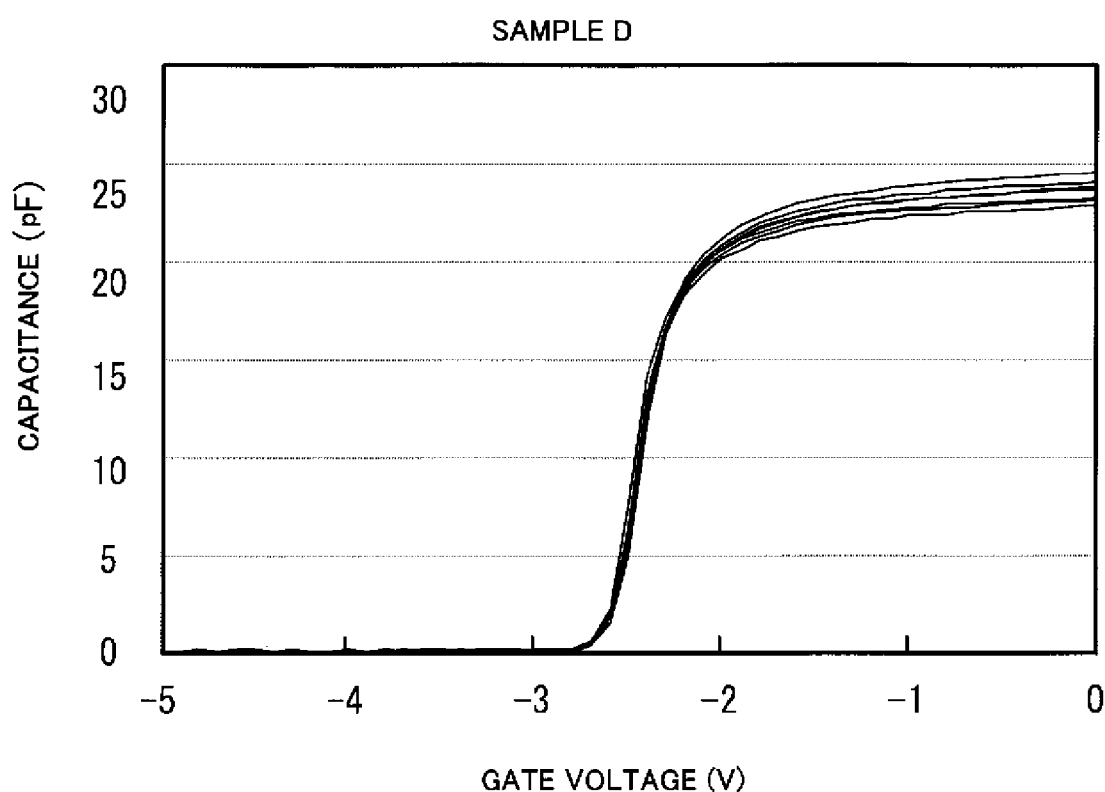
FIG. 12 is a gate capacitance vs. voltage characteristic of sample D after annealing.

FIGS. 11 and 12 are graphs of capacitance vs. gate voltage (C-V) characteristics of samples C and D. FETs of sample C annealed in the atmosphere of oxygen have large deviations, as compared to those of sample D. This shows that annealing is preferably performed in an atmosphere free of oxygen.

As described above, the material of the Schottky electrode that contacts the semiconductor layer is made of ITO and is annealed, so that the Schottky characteristic can be drastically improved. Preferably, annealing is performed in an atmosphere free of oxygen. The reason why annealing is preferably performed in an atmosphere free of oxygen is considered as follows.

Figure 13:
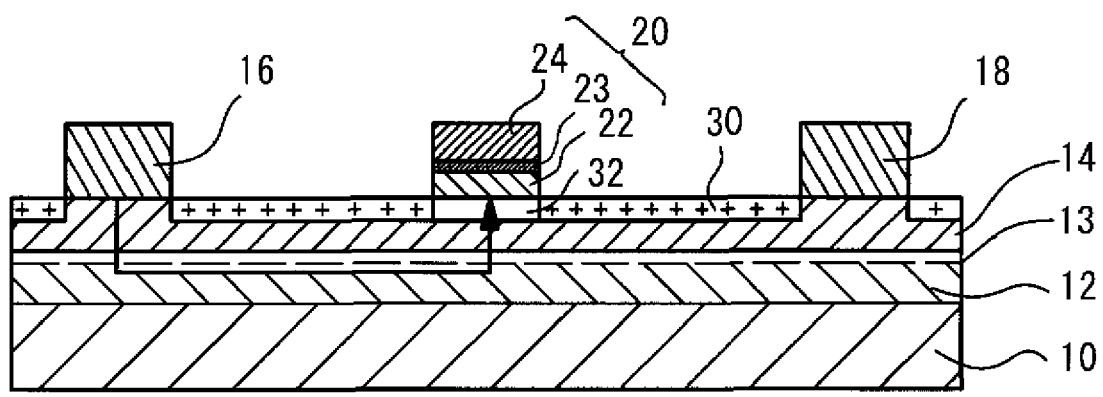
FIG. 13 shows a conceivable cause of leakage current.
Figure 14A:
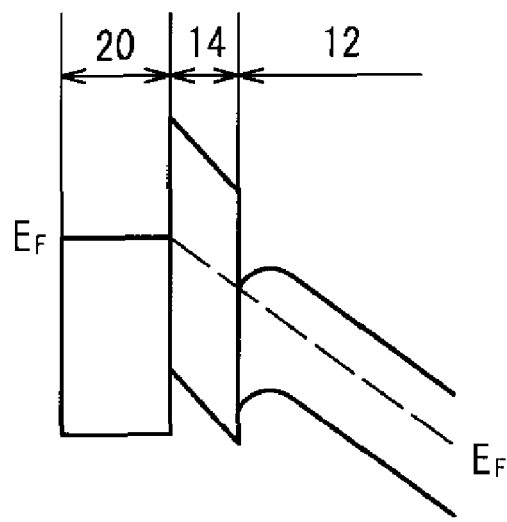
FIGS. 14A and 14B are energy band diagrams of a gate electrode and layers below the gate electrode.
Figure 14B:
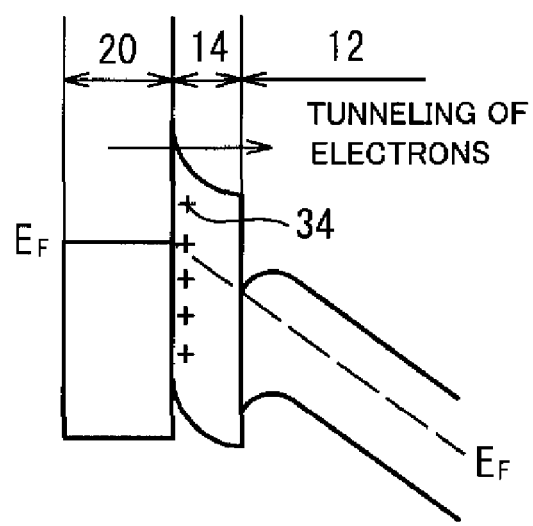

Referring to FIG. 13, an oxide layer is formed on the surface of the AlGaN electron supply layer 14. The reverse current flows from the source electrode 16 to the gate electrode 20 via the two-dimensional electron gas (2DEG) 13, as indicated by an arrow. FIGS. 14A and 14B are energy band diagrams in the vertical direction below the gate electrode 20 with a reverse voltage being applied. Ideally, as shown in FIG. 14A, the electron supply layer 14 functions as a barrier between the gate electrode 20 and the electron traveling layer 12, and the leakage current must be small. However, when an oxide layer is formed on the surface of the electron supply layer 14, as shown in FIG. 14B, a level 34 is formed on the surface of the electron supply layer 14. Thus, the band is curved and the barrier width is reduced. This allows electrons to pass through the barrier by tunneling and increases the leakage current.

Referring to FIG. 13, the film of the gate electrode 20 that contacts the electron supply layer 14 is designed to contain indium. In annealing, ITO exhibits gettering to remove oxygen from an oxide layer 30 on the surface of the AlGaN electron supply layer 14 and removes oxygen generated in the electron supply layer 14 therefrom, so that a gettering layer 32 is formed. Thus, the level 34 due to oxygen as shown in FIG. 14B disappears, and the ideal Schottky junction as shown in FIG. 14A can be obtained and the forward and reverse current can be reduced.

The C-V characteristics reflect the state of the oxide layer 30 on the surface of the electron supply layer 14. In sample C, annealing in the oxygen atmosphere facilitates oxidization of the surface of the electron supply layer 14. Different FETs have different surface states in sample C due to oxidization. This may cause the different FETs to have great differences in the C-V characteristics.

Figure 15:
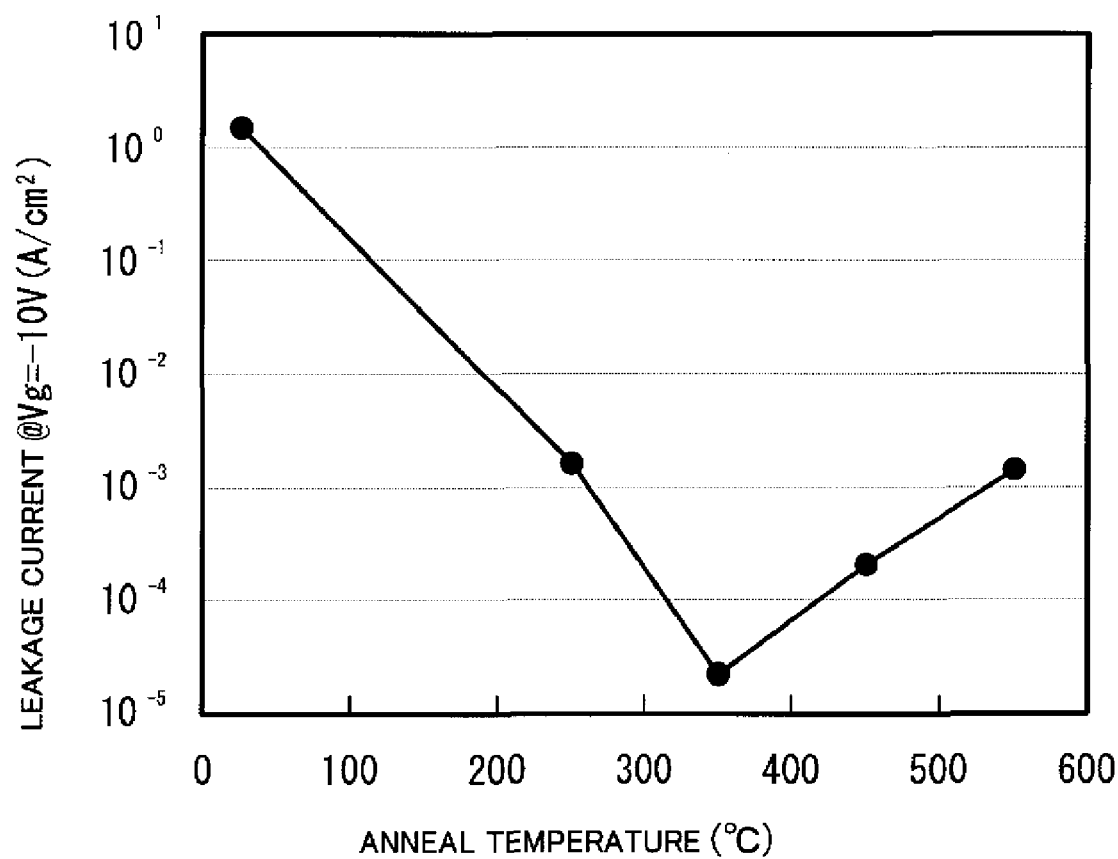
FIG. 15 is a graph of leakage current as a function of anneal temperature.

FIG. 15 is a graph of a leakage current as a function of the anneal temperature in a case where the gate electrode is formed by ITO/Ni/Au and annealing is performed in a nitrogen atmosphere. The vertical axis of the graph shows the amount of leakage current per unit area ($A/cm^2$) with a voltage of −10 V. Annealing in the nitrogen atmosphere realizes triple-digit reduction in leakage current in an annealing temperature of 250° C. to 550° C.

Figure 16A:
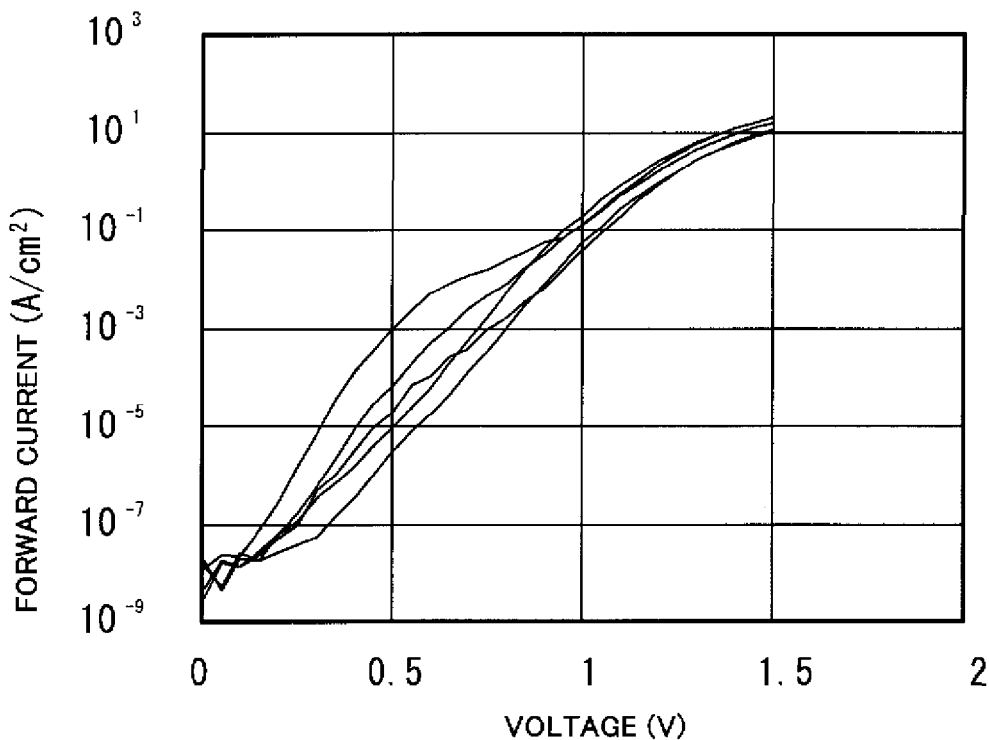
FIGS. 16A and 16B are gate current vs. voltage characteristics of sample E prior to annealing.
Figure 16B:
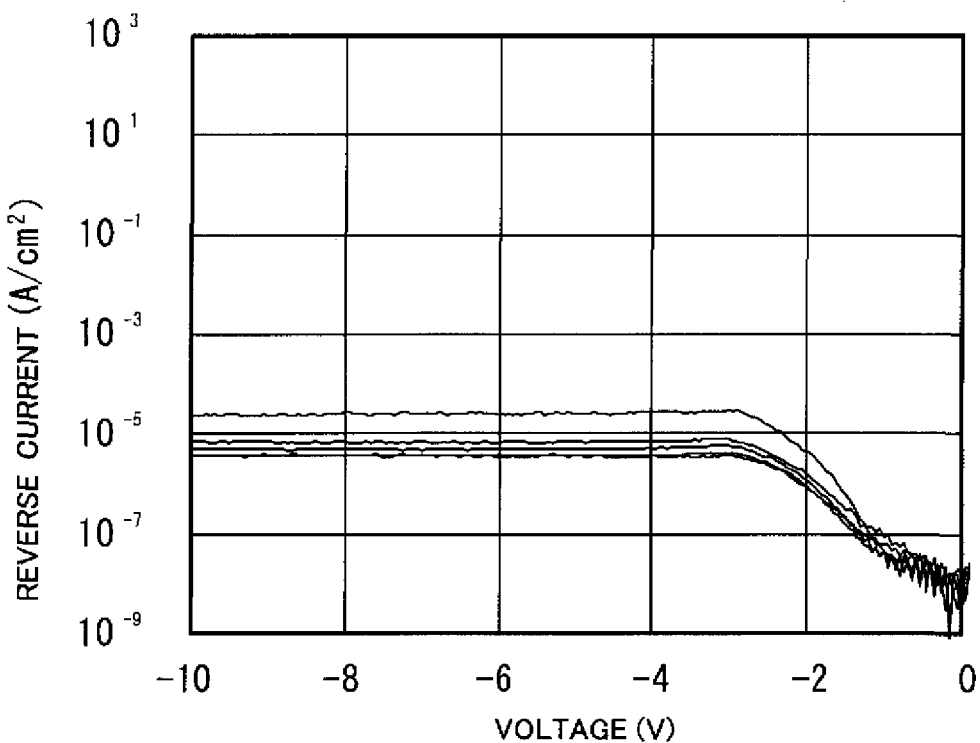

FIGS. 16A and 16B show gate forward and reverse characteristics of sample E prior to annealing. FIGS. 17A and 17B show gate forward and reverse characteristics of sample C after annealing. The Schottky characteristics can be improved by annealing even for sample E with the gate electrode 20 of In$_2$O$_3$/Ni/Au. The layer that contacts the electron supply layer 14 is not limited to ITO but may be an arbitrary layer that contains indium. The layer that contains indium exhibits the gettering effect to the surface of the electron supply layer 14 and improves the Schottky characteristics.

Second Embodiment

A second embodiment has the gate electrode 20 formed by a process different from that employed in the first embodiment. FIGS. 18A through 18D are cross-sectional views of an FET in accordance with the second embodiment.

Figure 18A:
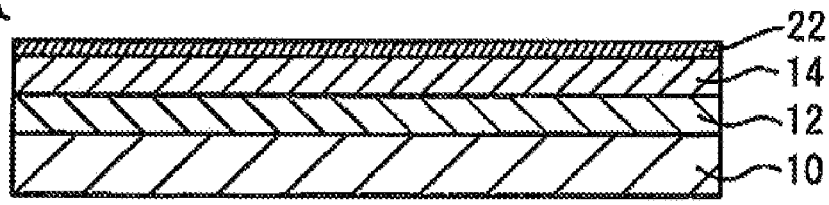
FIGS. 18A through 18D are cross-sectional views showing a method for manufacturing an FET in accordance with a second embodiment.
Figure 18B:
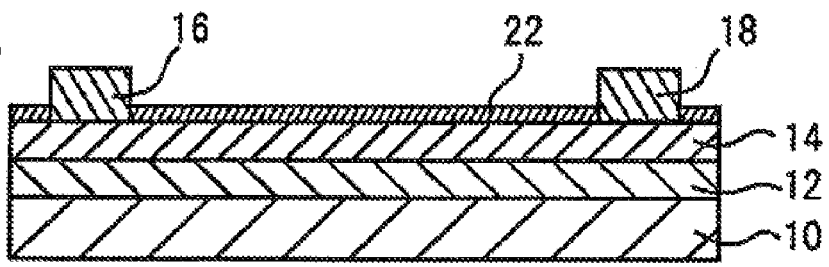
Figure 18C:
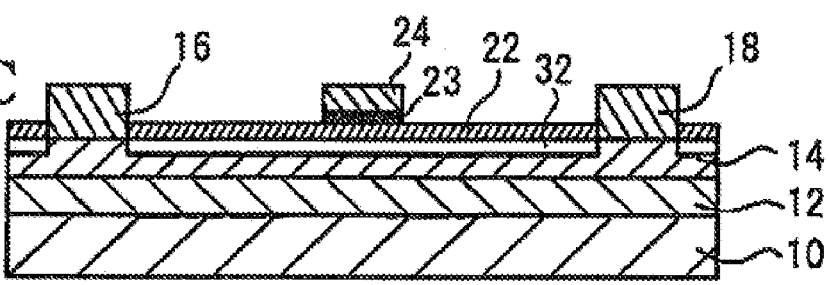
Figure 18D:
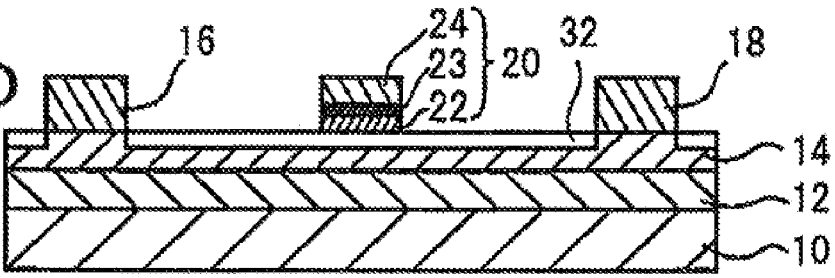

Referring to FIG. 18B, the layer 22 containing indium is partially removed to expose the electron supply layer 14. The source electrode 16 and the drain electrode 18 are formed on the exposed surfaces of the electron supply layer 14. Referring to FIG. 18C, the barrier layer 23 of Ni is deposited to a thickness of 80 nm on the layer 22 containing indium, and the Au layer 24 having a thickness of 100 nm is formed on the barrier layer 23. Then, the wafer is annealed in the nitrogen atmosphere. Thus, oxygen is subjected to gettering by the layer that contains indium, and the oxygen gettering layer 32 is thus formed. Referring to FIG. 18D, the layer 22 is removed except a portion that is to be the gate electrode. Thus, the gate electrode 20 is formed and the FET of the second embodiment is completed.

The second embodiment is capable of removing oxygen from the electron supply layer 14 between the source electrode 16 and the drain electrode 18 (that is, between the Schottky electrode and the ohmic electrode) by gettering. The leakage current may be caused by oxygen within the electron supply layer 14 captured therein during the growth other than oxygen on the oxide layer on the surface of the electron supply layer 14. The second embodiment is capable of removing oxygen in the electron supply layer 14 along with oxygen on the surface of the electron supply layer 14 by gettering. It is thus possible to restrain the leakage current more effectively.

When the layer containing indium is deposited by MOCVD, the layer 22 may be grown subsequently after the nitride semiconductor layer is grown. Thus, the manufacturing process may be simplified.

The above-mentioned first and second embodiments have the electron supply layer 14 made of AlGaN. The surface of the nitride semiconductor is easily oxidized. The layer 22 of the Schottky electrode that contains indium and contacts the nitride semiconductor contributes improving the Schottky characteristics.

Particularly, the surface of the AlGaN, InAlGaN or GaN layer is easily oxidized and is frequently used for the Schottky junction. Thus, the nitride semiconductor layer is preferably includes a layer of AlGaN, InAlGa or GaN that contacts the layer 22 containing indium. This structure brings about improved Schottky electrodes. Particularly, the layer 22 containing indium is more preferably provided when the Schottky electrode is formed on the AlGaN layer.

The Schottky electrode may be formed by only the layer 22 that contains indium such as ITO. In order to improve the rising response of the forward current, the Au layer 24 is preferably provided on the barrier layer 23 provided on the layer 22. The barrier layer 23 is not limited to Ni, but may be made of another material that functions as a barrier between the indium-contained layer 22 and the Au layer 24.

Preferably, the Schottky electrode includes an In$_2$O$_3$ layer or ITO layer. The layer 22 that contains indium may be formed by sputtering and etching other than vacuum evaporation and liftoff employed in the first embodiment. The second embodiment may employ vacuum evaporation, sputtering or ALD (Atomic Layer Deposition) other than MOCVD.

In order to prevent the surface of the nitride semiconductor layer from being oxidized, annealing is preferably performed in an atmosphere of an inactive gas. Further, as shown in FIG. 15, annealing is preferably carried out at a temperature of 250° C. to 550° C.

The Schottky electrode of the present invention may be applied to not only the above-mentioned lateral FETs on which the source and drain electrodes (a pair of electrodes) are formed on the nitride semiconductor layer but also a vertical FET in which the source electrode is formed above the nitride semiconductor layer and the drain electrode is formed below the nitride semiconductor layer. Further, the Schottky electrode of the present invention may be applied to other types of semiconductor devices having the Schottky junctions, such as Schottky diodes.

The present invention is not limited to the specifically described embodiments, but may include other embodiments and variations without departing from the scope of the present invention.

The present application is based on Japanese Patent Application No. 2006-316508, the entire disclosure of which is hereby incorporated by reference.

What is claimed is:

1. A method for manufacturing a semiconductor device comprising:
    forming a Schottky electrode having a layer contains indium and directly contacts a nitride semiconductor layer including channel layer;
    forming a pair of ohmic electrodes that electrically contacts the channel layer; and
    annealing the semiconductor device in an atmosphere of an inactive gas so that a Schottky junction located between the layer and the nitride semiconductor layer is formed,
    wherein the layer is one of an indium oxide layer and an indium tin oxide layer,
    wherein the annealing is performed at a temperature of 250° C. to 550° C.

2. The method as claimed in claim 1, wherein the nitride semiconductor layer includes a layer that contacts the Schottky electrode and contains AlGaN, InAlGaN or GaN.

3. The method as claimed in claim 1, further comprising forming a barrier layer on the layer, and forming an Au electrode on the barrier layer.

4. The method as claimed in claim 1, wherein the inactive gas is a nitrogen gas.

5. The method for manufacturing a semiconductor devise comprising:
    forming the Schottky electrode that contacts a nitride semiconductor layer including a channel layer and contains indium;
    forming a pair of ohmic electrodes that electrically contacts the channel layer; and
    annealing the semiconductor device in and atmosphere of an inactive gas, wherein forming the Schottky electrode includes:
    forming a layer that contains indium on the nitride semiconductor layer; and
    removing, after said annealing, said layer that contains indium except a portion that is to be a part of the Schottky electrode.

6. The method as claimed in claim 1, wherein the layer is forming by one of vacuum evaporation, sputtering, MOCVD and ALD.

* * * * *